United States Patent
Cho (10) Patent No.: US 7,566,961 B2
(45) Date of Patent: Jul. 28, 2009

(54) MULTI-STACKED PACKAGE AND METHOD OF MANUFACTURING THE SAME

(75) Inventor: Yeoung-Jun Cho, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 331 days.

(21) Appl. No.: 11/609,840

(22) Filed: Dec. 12, 2006

(65) Prior Publication Data

US 2007/0138631 A1 Jun. 21, 2007

(30) Foreign Application Priority Data

Dec. 19, 2005 (KR) ...................... 10-2005-0125138

(51) Int. Cl.
*H01L 23/02* (2006.01)
(52) U.S. Cl. ...................... 257/686; 257/777; 257/778; 438/109; 438/108
(58) Field of Classification Search ................ 257/686, 257/777, 778; 438/107, 108, 109
See application file for complete search history.

(56) References Cited

U.S. PATENT DOCUMENTS

| | | | |
|---|---|---|---|
| 6,894,378 B2 | 5/2005 | Winderl | |
| 7,129,420 B2* | 10/2006 | Hashimoto | 174/260 |
| 7,365,416 B2* | 4/2008 | Kawabata et al. | 257/686 |
| 7,378,726 B2* | 5/2008 | Punzalan et al. | 257/686 |
| 7,429,792 B2* | 9/2008 | Lee et al. | 257/712 |
| 2008/0157326 A1* | 7/2008 | Han et al. | 257/686 |

FOREIGN PATENT DOCUMENTS

| | | |
|---|---|---|
| KR | 1999-0086915 | 12/1999 |
| KR | 10-0271656 | 8/2000 |
| KR | 2004-0104907 | 12/2004 |

OTHER PUBLICATIONS

English language abstract for Korean Publication No. 10-0271656.
English language abstract for Korean Publication No. 2004-0104907.

* cited by examiner

*Primary Examiner*—S. V Clark
(74) *Attorney, Agent, or Firm*—Marger Johnson & McCollom, P.C.

(57) ABSTRACT

A multi-stacked package includes a first package, a second package and a combining member. The second package supports the first package, and is electrically connected to the first package and has at least one joint hole. The combining member extends from the first package to below the second package to pass through the joint hole so that the combining member is partially exposed to improve the coherence between the first package and the second package.

16 Claims, 5 Drawing Sheets

MULTI-STACKED PACKAGE AND METHOD OF MANUFACTURING THE SAME

CROSS-REFERENCE TO RELATED APPLICATIONS

This application claims priority under 35 USC § 119 to Korean Patent Application No. 2005-125138 filed on Dec. 19, 2005, the contents of which is herein incorporated by reference in its entirety.

BACKGROUND

1. Technical Field

This disclosure relates to a multi-stacked package and a method of manufacturing the multi-stacked package. More particularly, the invention relates to a multi-stacked package having a plurality of packages that are physically and electrically connected to each other and are vertically stacked, and a method of manufacturing the multi-stacked package.

2. Description of the Related Art

In general, a semiconductor device is manufactured by a fabrication process for fabricating a semiconductor chip including an integrated circuit on a silicon substrate, an electrical die sorting (EDS) process for inspecting electrical characteristics of the semiconductor chip, and a packaging process for protecting the semiconductor chip.

Recently, the semiconductor devices for achieving a higher performance and a higher integration degree have been developed. Since the packaging technology may determine a size, a heat dissipation capacity, an electrical operation performance, a reliability and cost to manufacture the semiconductor device, an improved packaging technology is critically required for achieving the higher performance and the higher integration degree of the semiconductor device.

The packaging techniques have developed from a single inline package (SIP), a dual inline package (DIP), a quad flat package (QFP) and a ball grid array (BGA) in the order named. Recently, in order to improve a mounting efficiency per a unit volume, packaging technologies such as a chip scale package (CSP), a multi-chip package (MCP), a stacked-chip scale package (SCSP) and a wafer level chip scale package (WLCSP) have been disclosed. Further, a wafer level package (WLP) has been developed. According to the WLP, after semiconductor chips are mounted on a substrate, a series of assembling processes of die-bonding, molding, trimming and marking is carried out and then the substrate is cut to manufacture a semiconductor device.

As one of the recently developed packing techniques, a multi-stacked package (MSP) technology is disclosed. According to the MSP technology, a plurality of packages is vertically stacked on the substrate to scale down the semiconductor device.

Semiconductor devices manufactured by the MSP technology are disclosed in U.S. Pat. No. 6,894,378, issued to Johann, in which a stacked semiconductor chip includes an electronic component.

In the semiconductor devices having a multi-stacked package structure, a "so-called" solder joint reliability between a bottom package and a stack package positioned over the bottom package may be significantly important. Hereinafter, a conventional semiconductor device having the multi-stacked package structure is described in detail.

Figure 1:
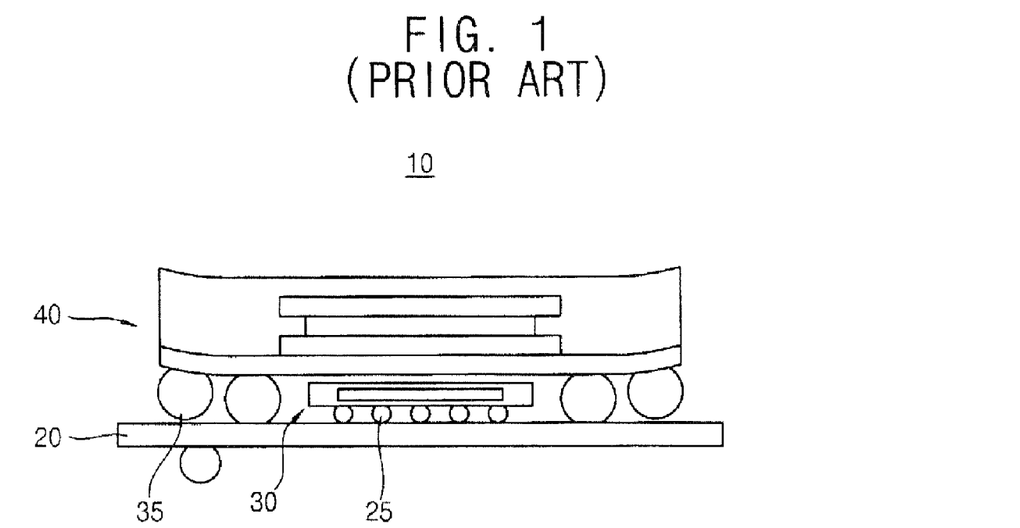
FIG. 1 is a cross-sectional view illustrating a conventional semiconductor device including a multi-stacked package structure.

FIG. 1 is a cross-sectional view illustrating a conventional semiconductor device including a multi-stacked package structure.

Referring to FIG. 1, a semiconductor device 10 includes a mounting board 20, a first package 30 and a second package 40.

The first package 30 is positioned on the mounting board 20. The second package 40 is positioned on the first package 30. The first package 30 is fixed to the mounting board 20 using first solder balls 25. The second package 40 is mounted over the first package 30 using second solder balls 35. The first and second packages 30 and 40 are vertically stacked on the mounting board 20, thereby completing a multi-stack package.

Since the first and second packages 30 and 40 receive a power and a signal through the first and second solder balls 25 and 35, the first and second solder balls 25 and 35 need to be firmly and accurately secured to a correct position of the mounting board 20. However, the first and second solder balls 25 and 35 may be frequently separated from the correct position of the mounting board 20 due to temperature, humidity, mechanical impact from falling, or a load applied thereto. A deviation of the first and second solder balls 25 and 35 from the correct position of the mounting board 20 is known as a "ball open." In the case of a "ball open," the first package 30, the second package 40 or the semiconductor device 10 may malfunction or may not operate at all. That is, the performance of the semiconductor device 10 may depend on the solder joint reliability.

When the semiconductor device does not function properly due to a ball open, the resulting economic loss can be severe. Therefore, an improvement of the solder joint reliability in the semiconductor device is critical for the semiconductor industry.

SUMMARY

The example embodiment of the invention provides a multi-stacked package that is capable of improving a solder joint reliability. The example embodiment of the invention also provides a method of manufacturing the multi-stacked package.

In one embodiment, a multi-stacked package includes a first package, a second package and a combining member. The second package supports the first package, and is electrically connected to the first package and has at least one joint hole. The combining member extends from the first package to below the second package to pass through the joint hole so that the combining member is partially exposed to improve the coherence between the first package and the second package.

BRIEF DESCRIPTION OF THE DRAWINGS

The above and other features and advantages of the invention will become readily apparent by reference to the following detailed description when considered in conjunction with the accompanying drawings wherein.

DETAILED DESCRIPTION OF EXAMPLE EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
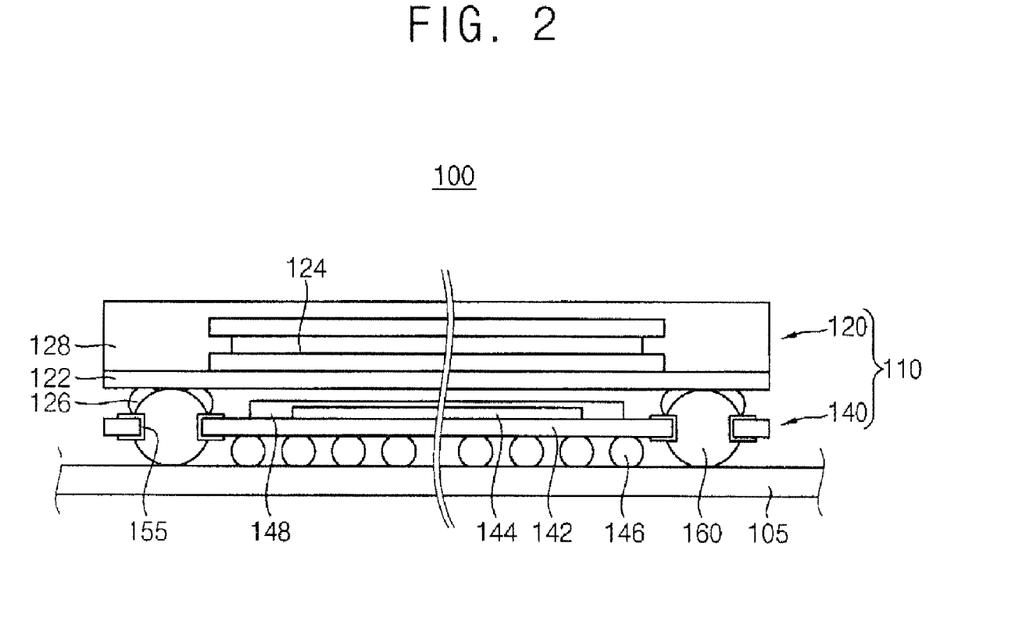
FIG. 2 is a cross-sectional view illustrating a multi-stacked package in accordance with an example embodiment of the invention.
Figure 3:
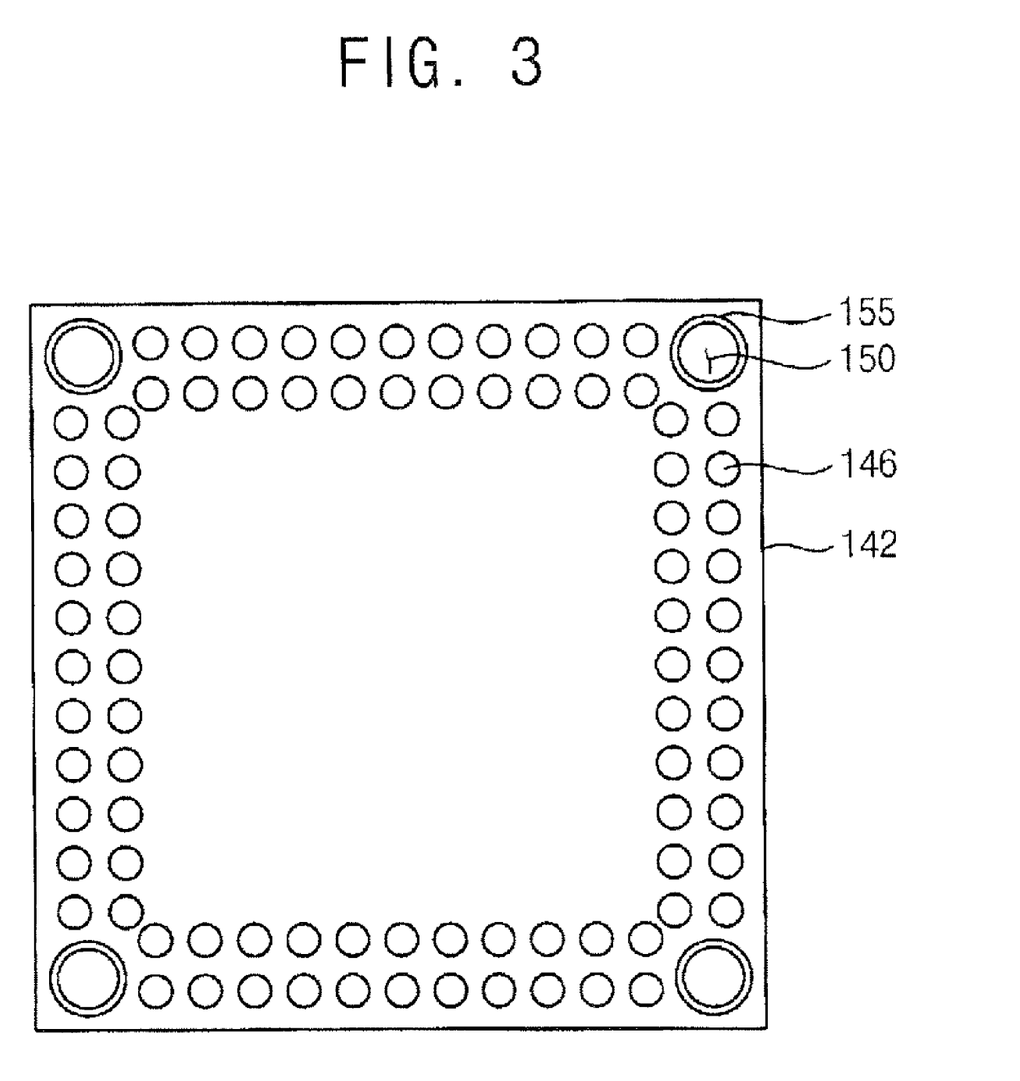
FIG. 3 is a plan view of a lower surface of the second substrate of the multi-stacked package in FIG. 2.

FIG. 2 is a cross-sectional view illustrating a multi-stacked package in accordance with an example embodiment of the invention. FIG. 3 is a plan view of a lower surface of the second substrate of the multi-stacked package in FIG. 2.

Referring to FIGS. 2 and 3, a multi-stacked package 110 includes a first package 120, a second package 140 and a combining member 160. The first package 120 includes a first substrate 122, a first semiconductor chip 124 and first conductive balls 126.

The first substrate 122 may have a rectangular shape or other suitable shapes such as a square shape. The first substrate 122 includes a first circuit (not shown) receiving an external signal or transmitting the external signal. For example, the first substrate 122 corresponds to a printed circuit board (PCB).

The first semiconductor chip 124 is positioned (or stacked) on the first substrate 122. The first semiconductor chip 124 is electrically connected to the first circuit. A plurality of the first semiconductor chips may be vertically or laterally arranged on the first substrate 122. Further, the first semiconductor chip 124 may be positioned on an upper surface or a lower surface of the first substrate 122.

A first protection member or an encapsulant 128 surrounding the first semiconductor chip 124 may be further positioned on the first substrate 122. The first protection member 128 may include an epoxy resin. The first protection member protects the first semiconductor chip 124 from an external shock and secures the first semiconductor chip 124 to the first substrate 122.

The first conductive balls 126 are arranged beneath the first substrate 122. The first conductive balls 126 are electrically connected to the first circuit. The first circuit may receive a signal through the first conductive balls 126 and/or may transmit a signal through the first conductive balls 126.

The first package 120 is stacked on the second package 140. Thus, the first package 120 corresponds to a top package of the multi-stacked package 110 and the second package 140 corresponds to a bottom package of the multi-stacked package 110.

The second package 140 includes a second substrate 142, a second semiconductor chip 144 and second conductive balls 146.

The second substrate 142 may have a rectangular shape or other suitable shapes such as a square. The second substrate 142 includes a second circuit (not shown) receiving an external signal or transmitting the external signal. For example, the first substrate 142 corresponds to a printed circuit board (PCB). The second substrate 142 may have a size and a thermal expansion coefficient approximately the same as those of the first substrate 122. However, the second substrate 142 may have a size and thermal expansion coefficient different from those of the first substrate 122. At least one joint hole 150 is formed through the second substrate 142.

The joint hole 150 vertically penetrates the second substrate 142. An inner diameter of the joint hole 150 may be larger than outer diameters of the first and the second conductive balls 126 and 146. For example, the inner diameter of the joint hole 150 is at least about 1.5 times greater than the outer diameters of the first and the second conductive balls 126 and 146.

A plurality of the joint holes 150 may be formed at a peripheral portion of the second substrate 142. In one example embodiment of the invention, four joint holes may be formed with a single joint hole located at each corner portion of the rectangular second substrate 142. In another embodiment of the invention, eight joint holes may be formed along the peripheral portion of the second substrate 142. The positions and numbers of the joint holes 150 may be variously modified depending on packaging conditions within the spirit and scope of the invention.

The combining member 160 is positioned in the joint hole 150. When a plurality of the joint holes is formed through the second substrate 142, each of the combining members penetrates into or extends through a corresponding one of the joint holes 150. The combining member 160 will be described in detail below.

A conductive layer 155 may be formed on an inner side surface of the joint hole 150 and upper and lower surfaces of the second substrate 142 around or adjacent the joint hole 150. The conductive layer 155 electrically connects the first and the second packages 120 and 140 to the combining member 160. The conductive layer 155 may be selectively formed on the second substrate 142. The conductive layer 155 may include nickel (Ni), gold (Au), titanium (Ti), copper (Cu), palladium (Pd), chromium (Cr), aluminum (Al), or combinations thereof. The conductive layer 155 is electrically connected to the second circuit. Thus, the combining member 160 is electrically connected to the second circuit through the conductive layer 155. In a modified example embodiment, the conductive layer 155 may be electrically connected to the second conductive balls 146, so that the combining member 160 may be electrically connected to the second conductive balls 146.

The second semiconductor chip 144 is mounted on the second substrate 142. The second semiconductor chip 144 is electrically connected to the second circuit. A plurality of second semiconductor chips 144 may be positioned vertically or laterally on the second substrate 142. The second semiconductor chip 144 may be positioned on an upper or lower surface of the second substrate 142.

A second protection member or encapsulant 148 is positioned on the second substrate 142, surrounding the second semiconductor chip 144. The second protection member 148 protects the second semiconductor chip 144 from an external shock and secures the second semiconductor chip 144 to the second substrate 142.

Although the example embodiment of the invention discloses that the shape of the second semiconductor chip 144 is different from that of the first semiconductor chip 124, the second semiconductor chip 144 may also have a shape the same as that of the first semiconductor chip 124, within the spirit and scope of the invention.

The second conductive balls 146 are positioned beneath the second substrate 142. The second conductive balls 146 are electrically connected to the second circuit. The second circuit receives the signal or externally transmits the signal through the second conductive balls 146.

The first and the second packages 120 and 140 may be electrically connected to each other. Particularly, the first conductive balls 126 of the first package 120 are electrically connected to the first circuit. The first conductive balls 126 are secured to the second substrate 142 to be electrically connected to the second circuit of the second package 140. Thus, the first and the second packages 120 and 140 are electrically connected to each other.

The operation of the multi-stacked package 110 is determined by the signals communicating between the first and the second packages 120 and 140, and the successful communication of the signals depends on strong physical and electrical connection of the first and the second packages 120 and 140 to each other. In the present embodiment, the first conductive balls 126 of the first package 120 are strongly secured to the second substrate 142, and the first and the second packages 120 and 140 are spaced apart from each other by a substantially uniform interval, so that the first and the second packages 120 and 140 are strongly secured together by the combining member 160. As a result, the multi-stacked package 110 of an example embodiment enables successful signal communication and operation of the multi-stacked package with much improved reliability.

The combining member 160 has an approximately spherical shape of which a diameter corresponds to the inner diameter of the joint hole 150. For example, the combining member 160 includes an approximately spherical shape having a diameter substantially larger than the inner diameter of the joint hole 150. Since the inner diameter of the joint hole 150 is larger than the outer diameters of the first and the second conductive balls 126 and 146, the diameter of the combining member 160 is substantially larger than the outer diameters of the first and the second conductive balls 126 and 146.

The combining member 160 includes a conductive material. For example, the conductive material includes silver (Ag), aluminum (Al), argenic (As), bismuth (Bi), cadmium (Cd), copper (Cu), iron (Fe), indium (In), nickel (Ni), antimony (Sb), zinc (Zn), etc. These can be used alone or in a combination thereof. The combining member 160 may have a material different from those included in the first and the second conductive balls 126 and 146. Alternatively, the combining member 160 may have a material substantially the same as those included in the first and the second conductive balls 126 and 146.

An upper portion of the combining member 160 makes contact with a lower surface of the first substrate 122. A contact area between the combining member 160 and the first substrate 122 is substantially larger than a contact area between the first conductive balls 126 and the first substrate 122. Thus, the combining member 160 is more strongly secured to the first substrate 122 than the first conductive balls 126 are secured to the first substrate 122.

In one embodiment, a central portion of the combining member 160 makes contact with a sidewall of the joint hole 150 formed through the second substrate 142. The combining member 160 makes contact with the second substrate 142 along the inner surface of the joint hole 150. Thus, a contact area between the combining member 160 and the second substrate 142 is larger than a contact area between the first conductive balls 126 and the second substrate 142. As a result, the combining member 160 is more strongly secured to the second substrate 142 than the first conductive balls 126 are secured to the second substrate 142.

When the conductive layer 155 is formed on the second substrate 142, the combining member 160 is electrically connected to the second substrate 142. If the second substrate 142 is electrically connected to the first substrate 122, the combining member 160 may be electrically connected to the first substrate 122.

The combining member 160 penetrates through the second package 140 and the lower portion of the combining member 160 is exposed from a bottom surface of the second package 140.

As described above, the combining member 160 is secured to both of the first and the second packages 120 and 140, so that the first and the second packages 120 and 140 are more strongly secured to each other. Thus, the first and the second packages 120 and 140 may be spaced apart from each other by a substantially uniform interval and the subsequent separation of the first package 120 from the second package 140 may be sufficiently reduced.

For example, when thermal expansion coefficients of the first and second packages 120 and 140 are different from each other, the first and second packages 120 and 140 are variously deformed in accordance with environmental factors such as temperature and humidity. The above deformation difference between the first and the second packages 120 and 140 may cause physical separation of the first conductive balls 126 from the second substrate 142. That is, the first conductive balls 126 may be easily separated from a peripheral portion of the second substrate 142 due to the difference in the amount of deformation between the first and the second packages 120 and 140.

However, in an example embodiment of the invention, the first package 120 and the second package 140 are strongly secured to each other by the combining member 160, so that the first and the second packages 120 and 140 are spaced apart by a substantially uniform interval. Therefore, the first conductive balls 126 may be prevented from being separated from the second substrate 142. Particularly, the combining members 160 are arranged along a peripheral portion of the second substrate 142 to effectively prevent the first conductive balls 126 from being separated from the second substrate 142.

The multi-stacked package 110 may be mounted on a mounting board 105, to thereby manufacture a semiconductor device 100.

The mounting board 105 may include a printed circuit board. The mounting board 105 supplies power to the multi-stacked package 110. The mounting board 105 transmits a signal to the multi-stacked package 110 and receives a signal from the multi-stacked package 110. That is, the mounting board 105 is electrically connected to the multi-stacked package 110. In the present embodiment, the second conductive balls 146 and the combining member 160 are secured to the mounting board 160, so that the mounting board 105 is electrically connected to the multi-stacked package 110.

When the multi-stacked package 110 is mounted on the mounting board 105, the multi-stacked package 110 is more strongly secured to the mounting board 105 due to an increase in the contact area between the multi-stacked package 110 and the mounting board 105. That is, the combining member 160 reinforces the combination force between the multi-stacked package 110 and the mounting board 105 as well as the combination force between the first and the second packages 120 and 140.

Additionally, heat in the first and the second packages 120 and 140 may be transferred to the mounting board 105 through the combining member 160, to thereby cool down the first and the second packages 120 and 140.

A power supplying line (not shown) for supplying power to the first and the second packages 120 and 140 may be connected to the combining member 160. The combining member 160 has such a large contact area between the first and the second packages 120 and 140 that the power is effectively supplied to the first and the second packages 120 and 140 by the combining member 160. In one example embodiment of the invention, the power is supplied to the first and the second packages 120 and 140 through the conductive layer 155. In another example embodiment of the invention, additional power lines may be directly connected to the first and second packages 120 and 140, or the power may be supplied to the first and second packages 120 and 140 through the first and second conductive balls 126 and 146.

In an example embodiment of the invention, the multi-stacked package 110 includes two component packages having the first and the second packages 120 and 140. Alternatively, three or more packages may also be included in the multi-stacked package 110 within the spirit and scope of the invention. When the multi-stacked package 110 includes three or more packages, the combining member 160 may be secured to all of the three or more packages. Alternatively, the combining member 160 may also be secured to a part of the three or more packages or a pair of two packages, which is arbitrarily selected from the three or more packages, in the same manner as described above.

According to an example embodiment of the invention, the combining member 160 may strengthen the combining force between the first package 120 and the second package 140 positioned over the first package 120, to thereby prevent a physical separation of the first and second packages 120 and 140 and an electrical short or open between the first and the second packages 120 and 140 due to the physical separation. As a result, the semiconductor device 100 may have an improved reliability.

Figure 4:
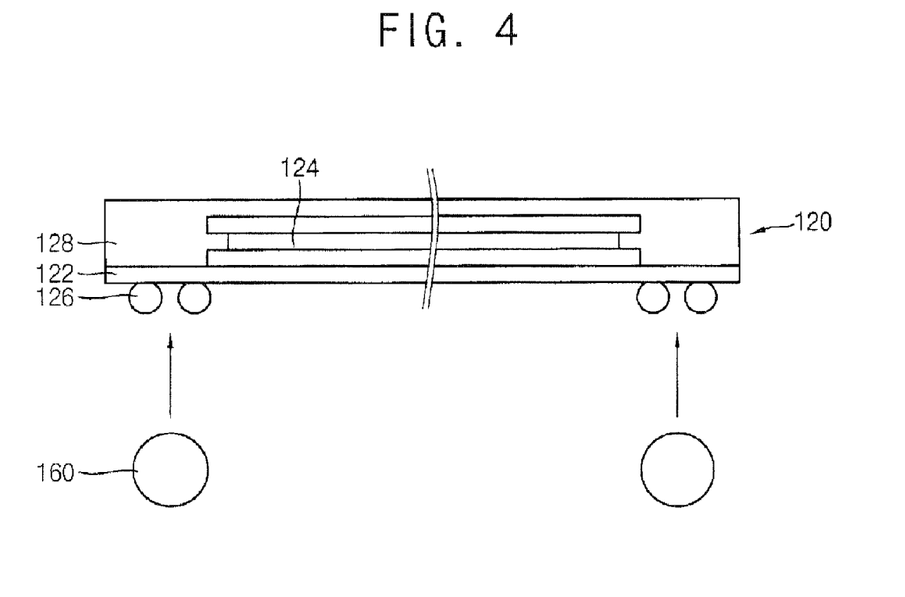
FIGS. 4 to 6 are cross-sectional views illustrating methods of manufacturing a multi-stacked package and a semiconductor device including the multi-stacked package in an example embodiment of the invention.
Figure 5:
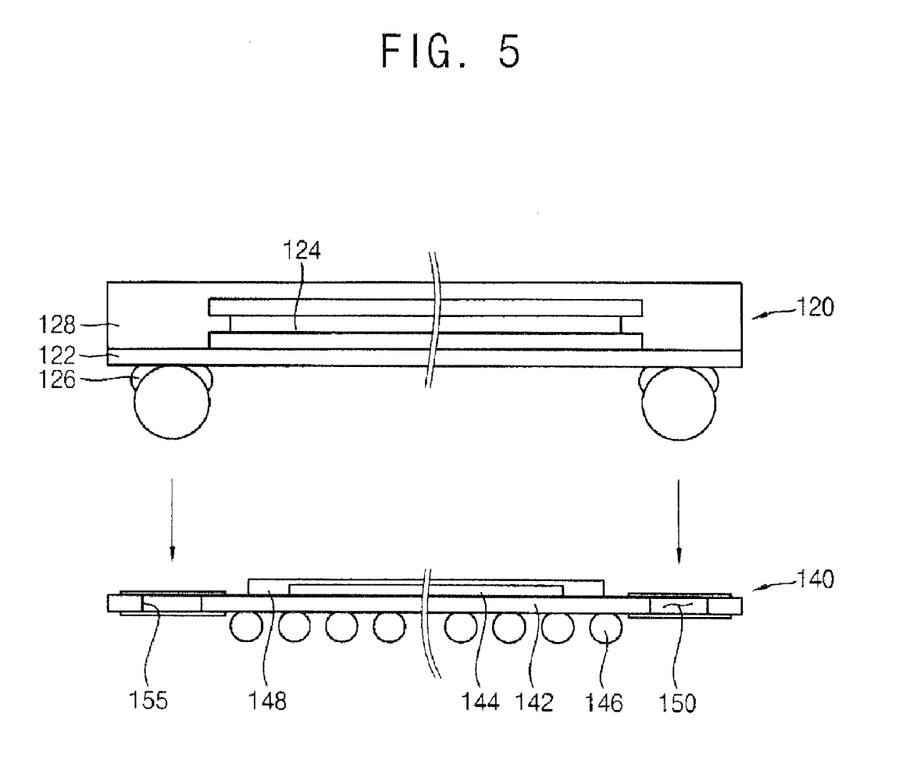
Figure 6:
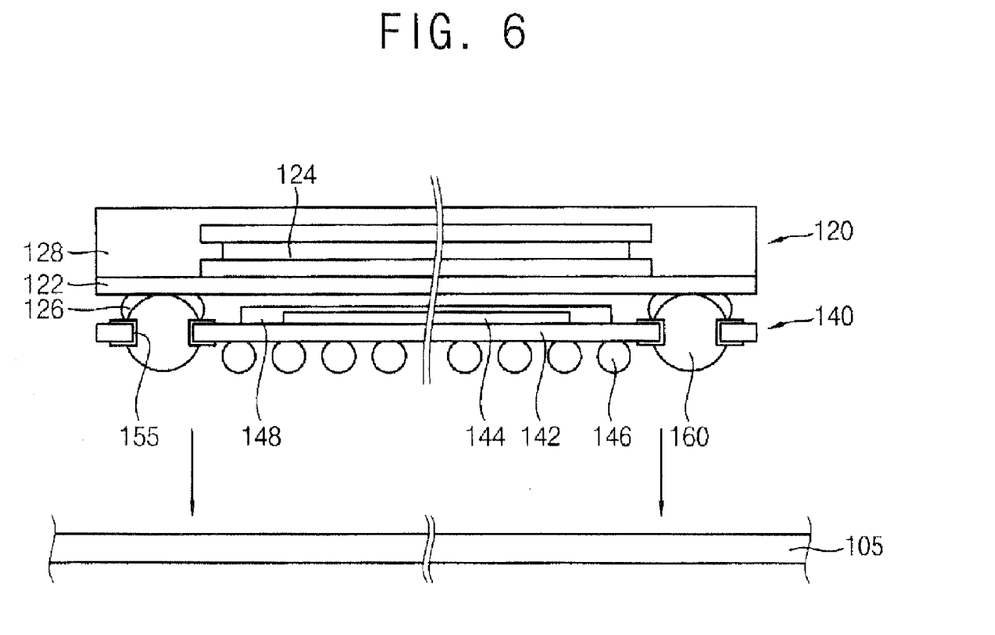

FIGS. 4 to 6 are cross-sectional views illustrating methods of manufacturing a multi-stacked package and a semiconductor device including the multi-stacked package in an example embodiment of the invention.

Referring to FIG. 4, a first package 120 is provided. For example, a first semiconductor chip 124 is mounted on a first substrate 122. First conductive balls 126 are positioned beneath the first substrate 122 having the first semiconductor chip 124. In an example embodiment of the invention, the first conductive balls 126 may be formed from a powder such as a solder paste using a silk-screen process. However, the first conductive balls 126 may be formed using other known techniques such as direct solder ball attach.

Referring to FIG. 5, a second package 140 is prepared. For example, a second semiconductor chip 144 is mounted on a second substrate 142 having at least one joint hole 150. Second conductive balls 146, which are electrically connected to the second semiconductor chip 144, are positioned beneath the second substrate 142. A plurality of joint holes 150 may be formed along a peripheral region of the second substrate 142. For example, four joint holes are formed at four corners of the rectangular-shaped second substrate 142. The number of the joint holes 150 and the position of each joint hole 150 may be adjusted in various ways depending on the conditions under which the packaging process is performed.

The first and second packages 120 and 140 may be formed substantially at the same time. Further, the first semiconductor chip 124 may have a shape substantially the same as that of the second semiconductor chip 144. That is, the first package 120 performs a function substantially the same as that of the second package 140. However, the present invention is not limited to this. The first and second packages 120 and 140 may each have a different shape and/or a different function.

Then, a conductive layer 155 is formed on the second package 140. Particularly, the conductive layer 155 may be formed on an inner surface of the joint hole 150 and upper and lower surfaces of the second substrate 142 near the joint hole 150. The conductive layer 155 may be further formed up to a region where the first conductive balls 126 are attached to an upper surface of the second substrate 142 and up to a region where the second conductive balls 146 are secured to a lower surface of the second substrate 142.

A combining member 160 is secured to the lower surface of the first substrate 122 (shown in FIG. 4). The combining member 160 is located at a position of the first substrate 122 corresponding to the joint hole 150. The combining member 160 may be arranged at the position having a central and vertical axis substantially the same as that of the joint hole 150.

Then, the first package 120 is positioned on the second package 140. Thus, the first conductive balls 126 of the first package 120 are secured to the second substrate 142 of the second package 140. The first conductive balls 126 may be further heated, to thereby reflow the first conductive balls 126. When the first conductive balls 126 are reflowed, shapes of the first conductive balls 126 may be changed.

The combining member 160 is secured to the second substrate 142, to thereby form a multi-stacked package 110. As a result, the combining member 160 extends from the lower surface of the first substrate 122 to the lower surface of the second substrate 142 through the joint hole 150. The combining member 160 may be further heated to reflow the combining member 160. The combining member 160 may be simultaneously heated when the first conductive balls 126 are heated.

Referring to FIG. 6, after the multi-stacked package 110 is prepared, the multi-stacked package 110 is mounted on a mounting board 105. For example, exposed portions of the second conductive balls 146 and the combining member 160 are secured to the mounting board 105, to thereby mount the multi-stacked package 110 on the mounting board 105. The combining member 160 and the first conductive balls 126 may be simultaneously heated to reflow the combining member 160 and the first conductive balls 126 at the same time. Thus, the shapes of the reflowed combining member 160 and the first conductive balls 126 may be changed.

The contact area between the combining member 160 and the mounting board 105 may be larger than the contact area between the second conductive balls 146 and the mounting board 105. Thus, the combining member 160 may be more strongly secured to the mounting board 105 than the second conductive balls 146 are secured to the mounting board 105. As a result, the joint reliability between the multi-stacked package 110 and the mounting board 105 may be improved.

The combining member 160 may be connected to a power line pad formed on the mounting board 105. The combining member 160 may receive power from the mounting board 105 and transmit the power to the first and second packages 120 and 140.

The combining member 160 penetrates from the first package 120 to the mounting board 105 through the joint hole 150 formed in the second package 140. Thus, the combining member 160 strongly secures the first and second packages 120 and 140 to the mounting board 105 with a substantially uniform interval.

In one example embodiment of the invention, after the multi-stacked package 110 is formed, the multi-stacked package 110 is combined with the mounting board 105 to manufacture a semiconductor device 100. In another example embodiment of the invention, the multi-stacked package 100 and the semiconductor device may be manufactured substantially at the same time.

Figure 7:
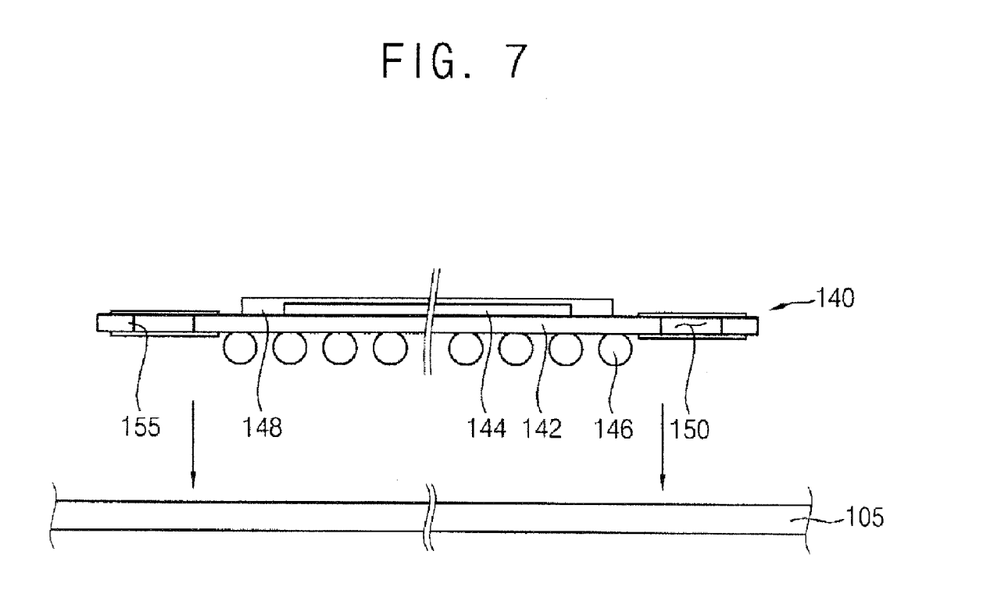
FIGS. 7 to 9 are cross-sectional views illustrating methods of manufacturing a multi-stacked package and a semiconductor device including the multi-stacked package in another example embodiment of the invention.
Figure 8:
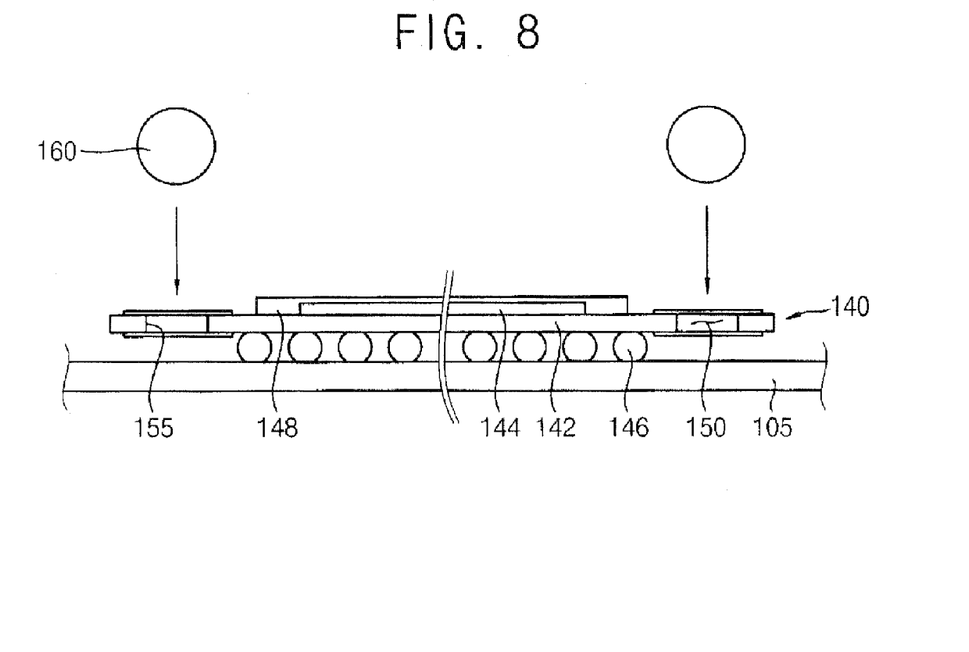
Figure 9:
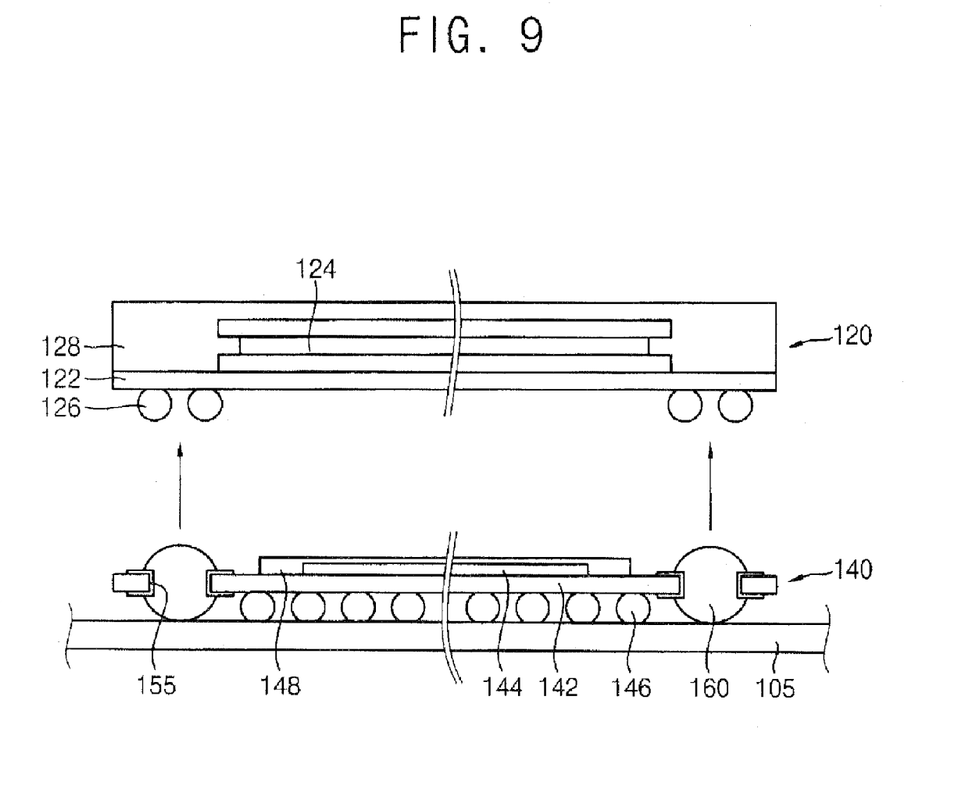

FIGS. 7 to 9 are cross-sectional views illustrating methods of manufacturing a multi-stacked package and a semiconductor device including the multi-stacked package in another example embodiment of the invention.

Referring to FIG. 7, a second package 140 is first provided. A conductive layer 155 may be formed on a second substrate 142, which is included in the second package 140. The conductive layer 155 may be formed on an inner side surface of the joint hole 150 and upper and lower surfaces of the second substrate 142 near the joint hole 150. The conductive layer 155 may be further formed up to a region where the second conductive balls 146 are secured to a lower surface of the second substrate 142.

The second package 140 is mounted on a mounting board 105. Second conductive balls 146 may be heated and reflowed to be electrically connected to the mounting board 105. Thus, the second package 140 may be physically and electrically connected to the mounting board 105.

Referring to FIG. 8, a combining member 160, which is protruded from the fist package 120, passes through a joint hole 150 formed in the second package 140 so that the combining member is partially exposed to improve the coherence between the first package and the second package.

The combining member 160 is secured to the mounting board 105 through the joint hole 150. The combining member 160 may be further heated and reflowed. Thereby, the combining member 160 may be physically and electrically connected to the mounting board 105.

The contact area between the combining member 160 and the mounting board 105 may be substantially wider than the contact area between the second conductive balls 146 and the mounting board 105. Thus, the combining member 160 may be more strongly secured to the mounting board 105 than the second conductive balls 146 are secured to the mounting board 105. As a result, the joint reliability between the multi-stacked package 110 and the mounting board 105 may be improved.

Referring to FIG. 9, a first package 120 is stacked over the second package 140. First conductive balls 126 are secured to an upper surface of the second substrate 142. The combining member 160 is secured to a peripheral portion of the first substrate 122. The first conductive balls 126 are heated and reflowed, to thereby secure the first conductive balls 126 to the second substrate 142. Alternatively, the first conductive balls 126 may be heated and reflowed to secure the first conductive balls 126 to the first substrate 122. The first conductive balls 126 and the combining member 160 may be heated substantially at the same time. Thus, the first and second packages 120 and 140 may be physically and electrically connected to each other. Further, the first package 120 and the combining member 160 may be physically and electrically connected to each other.

The contact area between the combining member 160 and the first substrate 122 may be substantially wider than the contact area between the first conductive balls 126 and the first substrate 122. Thus, the combining member 160 may be more strongly secured to the first substrate 122 than the first conductive balls 126 are secured to the first substrate 122. As a result, the joint reliability between the first and second packages 120 and 140 may be improved and the operational reliability of the multi-stacked package may be improved.

According to the invention, at least two packages may be firmly connected to each other physically and electrically. Thus, conductive balls of an upper package may be effectively prevented from getting separated from a substrate of a lower package. The joint reliability between the packages and the joint reliability between a multi-stacked package and a mounting board may be improved. Further, the multi-stacked package may have an improved heat-radiation characteristic. As a result, a reliable semiconductor device having a multi-stacked package may be manufactured.

According to one aspect of the invention, there is provided a multi-stacked package. The multi-stacked package includes a first package, a second package that supports the first package, is electrically connected to the first package, and has at least one joint hole, and a combining member protruded from the first package to below the second package to pass through the joint hole so that the combining member is partially exposed to improve a coherence between the first package and the second package.

In an example embodiment of the invention, the multi-stacked package nay further include a conductive layer formed on an inner side surface of the joint hole and on lower and upper surfaces of the second package around the joint hole. Here, the first package includes a first substrate secured to the combining member, a first semiconductor chip formed on the first substrate and first conductive balls formed beneath the first substrate, and the second package includes a second substrate though which the combining member is penetrated, a second semiconductor chip formed on the second substrate and second conductive balls formed beneath the second substrate.

In the example embodiment of the invention, the combining member has a size substantially greater than those of the first and second conductive balls. Here, the combining member has a substantially spherical shape. A plurality of the joint holes is formed along a peripheral portion of the second substrate. The second substrate has a rectangular shape and the joint holes are formed at four corners of the second substrate, respectively.

According to another aspect of the invention, there is provided a method of manufacturing a multi-stacked package. A first package is stacked on a second package including at least one joint hole. A combining member is protruded from the first package to below the second package to pass through the joint hole so that the combining member is partially exposed to improve coherence between the first package and the second package.

In this example embodiment of the invention, a conductive layer may be further formed on an inner side surface of the joint hole and lower and upper surfaces of the second package around the joint hole.

In another example embodiment of the invention, prior to stacking the first package on the second package, a first semiconductor chip is secured to a first substrate. First conductive balls connected to the first semiconductor chip, are formed beneath the first substrate. Here, the combining member and the first conductive balls may be heated substantially at the same time.

In yet another example embodiment of the invention, prior to stacking the first package on the second package, a second semiconductor chip may be secured to a second substrate having at least one joint hole. Second conductive balls connected to the second semiconductor chip are formed beneath the second substrate. Here, the combining member and the second conductive balls are heated substantially at the same time.

According to the invention, a joint reliability of the packages may be improved. Further, a joint reliability between the packages and the mounting board may be improved. Thus, a reliable semiconductor device may be manufactured.

Having described the preferred embodiments of the invention, it is noted that modifications and variations can be made by persons skilled in the art in light of the above teachings. It is therefore to be understood that changes may be made in the particular embodiment of the invention disclosed which is within the scope and the spirit of the invention outlined by the appended claims.

What is claimed is:

1. A multi-stacked package comprising:
    a first package;
    a second package supporting the first package, the second package being electrically connected to the first package and having at least one joint hole;
    a combining member extending from the first package to below the second package, the combining member disposed to pass through the joint hole so that the combining member is partially exposed below the second package; and
    a conductive layer formed on an inner surface of the joint hole and on lower and upper surfaces of the second package near the joint hole,
    wherein the first package includes a first substrate secured to the combining member, a first semiconductor chip disposed on the first substrate and first conductive balls disposed beneath the first substrate, and the second package includes a second substrate though which the combining member penetrates, a second semiconductor chip disposed on the second substrate and second conductive balls disposed beneath the second substrate, and
    wherein the combining member has a size substantially greater than those of the first and second conductive balls.

2. The multi-stacked package of claim 1, wherein the combining member has a substantially spherical shape.

3. The multi-stacked package of claim 1, wherein a plurality of the joint holes is formed along a peripheral portion of the second substrate.

4. The multi-stacked package of claim 1, wherein the second substrate has a rectangular shape, the second substrate has four joint holes, and one of the joint holes is formed at each of four corners of the second substrate.

5. A method of manufacturing a multi-stacked package, the method comprising:
    securing a first semiconductor chip to a first substrate;
    forming first conductive balls, which are electrically connected to the first semiconductor chip, beneath the first substrate;
    positioning a first package on a second package, the second package including a joint hole;
    forming a combining member protruded from the first package to below the second package to pass through the joint hole so that the combining member is partially exposed below the second package; and
    heating the combining member and the first conductive balls substantially simultaneously.

6. The method of claim 5, further comprising forming a conductive layer on an inner side of the joint hole and lower and upper surfaces of the second package.

7. The method of claim 5, prior to positioning the first package on the second package, further comprising:
    securing a second semiconductor chip to a second substrate having at least one joint hole; and
    forming second conductive balls, which are electrically connected to the second semiconductor chip, beneath the second substrate.

8. The method of claim 7, further comprising heating the combining member and the second conductive balls substantially simultaneously.

9. A method of manufacturing a multi-stacked package, the method comprising:
    providing a first semiconductor package, the first semiconductor package including at least one joint hole, wherein providing the first semiconductor package includes:
        mounting a first semiconductor chip on a first substrate; and
        forming first conductive balls on a lower surface of the first substrate, the first conductive balls electrically connected to the first semiconductor chip;
    mounting the first semiconductor package on a mounting board, wherein mounting the first semiconductor package on the mounting board comprises Positioning the first semiconductor package on the mounting board and heating the first conductive balls;

forming a combining member in the joint hole such that the combining member physically and electrically connects the first semiconductor package and the mounting board; and mounting a second semiconductor package on the first semiconductor package such that the combining member physically and electrically connects the second semiconductor package to the first semiconductor package.

10. The method of claim 9, wherein forming the combining member comprises positioning the combining member in the joint hole and heating the combining member.

11. The method of claim 10, wherein the first conductive balls and the combining member are heated substantially simultaneously.

12. The method of claim 9, wherein mounting the second semiconductor package on the first semiconductor package comprises:

mounting a second semiconductor chip on a second substrate;

forming second conductive balls on a lower surface of the second substrate, the second conductive balls electrically connected to the second semiconductor chip;

positioning the second semiconductor package on the first semiconductor package; and heating the second conductive balls.

13. The method of claim 12, wherein the combining member is heated substantially simultaneously with the second conductive balls.

14. A multi-stacked package, comprising:

a first package;

a second package disposed below the first package such that the first package is mounted on the second package;

a conductive member, the conductive member penetrating through the second package and disposed to contact the first package;

a first solder ball attached to an underside of the first package, the first solder ball connected to the second package; and a second solder ball attached to an underside of the second package, wherein a surface area of the conductive member in contact with the first package is larger than a surface area of the first solder ball in contact with the first package.

15. The multi-stacked package of claim 14, wherein a diameter of the conductive member is larger than a diameter of the first solder ball.

16. The multi-stacked package of claim 14, wherein the conductive member is also in contact with the second package.

* * * * *

UNITED STATES PATENT AND TRADEMARK OFFICE
CERTIFICATE OF CORRECTION

PATENT NO. : 7,566,961 B2
APPLICATION NO. : 11/609840
DATED : July 28, 2009
INVENTOR(S) : Yeoung-Jun Cho

Page 1 of 1

It is certified that error appears in the above-identified patent and that said Letters Patent is hereby corrected as shown below:

Column 2, line 22, the words "open,"", should read -- open." --;
Column 11, line 5, the word "nay" should read -- may --;
Column 12, line 65, claim 9, the word "Positioning" should read -- positioning --.

Signed and Sealed this

Twenty-ninth Day of September, 2009

David J. Kappos
*Director of the United States Patent and Trademark Office*